United States Patent
Koh (10) Patent No.: US 7,781,299 B2
(45) Date of Patent: Aug. 24, 2010

(54) LEADFRAME SEMICONDUCTOR PACKAGE STAND AND METHOD FOR MAKING THE SAME

(75) Inventor: Wei H. Koh, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 1487 days.

(21) Appl. No.: 11/094,557

(22) Filed: Mar. 31, 2005

(65) Prior Publication Data

US 2006/0228832 A1 Oct. 12, 2006

(51) Int. Cl.
*H01L 23/495* (2006.01)
*H01L 21/56* (2006.01)
*H01L 21/60* (2006.01)

(52) U.S. Cl. .................... 438/401; 438/116; 438/462; 29/832; 29/842

(58) Field of Classification Search ................ None
See application file for complete search history.

(56) References Cited

U.S. PATENT DOCUMENTS

| | | | | |
|---|---|---|---|---|
| 5,302,849 A | * | 4/1994 | Cavasin | 257/666 |
| 5,369,059 A | * | 11/1994 | Eberlein | 29/842 |
| 5,896,651 A | * | 4/1999 | Hawthorne | 29/832 |
| 2007/0132077 A1 | * | 6/2007 | Choi et al. | 257/676 |

* cited by examiner

*Primary Examiner*—Zandra Smith
*Assistant Examiner*—Pamela E Perkins
(74) *Attorney, Agent, or Firm*—Morland C. Fischer (57) ABSTRACT

A method is disclosed for making a leadframe package stand having application in semiconductor packaging and microelectronic assembly in which an IC device (e.g., a bare chip IC, a wafer level package, or a chipscale package) is received for electrical connection to a PWB or for vertical package over package stacking. Electrically conductive leadframe traces are arranged in an area array circuit pattern between outer leads at the periphery of the mold body of a leadframe for connection to the PWB to inner leads for connection to the IC device. The inner lead tips terminate at each side of the IC device in groups of parallel aligned rows and columns to facilitate connection to the IC device without using intermediate bonding wires. Prior to molding, the inner leads of the conductive traces are secured by sacrificial tie-bars or adhesive tape to prevent movement of the inner leads and possible short circuits during molding. A cavity is formed in the mold body during molding so as to lie above the inner leads. After molding, the sacrificial tie-bars are separated from the inner leads, and the IC device is located in the cavity to be assembled to the leadframe to complete a leadframe package.

20 Claims, 6 Drawing Sheets

FIG. 9

LEADFRAME SEMICONDUCTOR PACKAGE STAND AND METHOD FOR MAKING THE SAME

BACKGROUND OF THE INVENTION

1. Field of the Invention

This invention relates to a method for making a leadframe package stand for converting area array CSP type packages into leadframe type packages.

2. Background Art

Leadframe type packaging for semiconductor ICs has been used for more than 30 years. The most popular leadframe packages are used with various integrated circuits including ASIC, CPU, memory, microcontroller and DSP. The corresponding packaging formats for such integrated circuits include QFP (quad flat pack), TSOP (thin small outline packages), QFN (quad flat no leadframe), and MLF (microleadframe) packages. Following the trends in semiconductor packaging and assembly, the IC size and signal output (I/O) pad pitches are shrinking with the package size and I/O lead pitch.

The function of metal, electrically conductive leads in the leadframe is to fan out the original IC bonding pads to a larger area that have wider pitches for the leads such that the leads are more suitable to interconnection to a printed wiring board (PWB). The most commonly used method of electrical interconnection between the individual leads of a leadframe and its IC bonding pads is wire bonding. For wire bonding, the terminal ends of each lead need to be located in proximity to the receiving bonding pad on the IC to receive a short wire loop therebetween. A jumping wire bridges the gap or separation between the IC pad and the lead terminal. In the case where flip chip bumping uses solder or some other conductive materials (e.g., gold stud bump, conductive polymer bump, and the like), the lead terminal must be located directly above or below the specific IC bonding pad to receive the bump for interconnection. Hence, the layout or pattern of the leadframe must account for fanning in the outer leads to the inner lead tips that are connected to the IC bonding pads.

To provide easy accessibility and manufacturability, the leadframe leads typically stay in parallel aligned directions but generally shrink in width. Typically, the inner lead tips are aligned with one another along a single row with the appropriate pitch to receive the connecting wires. For ICs having perimeter pads along all four side of the IC body, the inner leads are arranged along four single rows, one row for each side of the body, to receive the wires. Sometimes, to relieve the tight pitch, the leads can be "offset" or staggered to form two parallel rows such that the wires with a shorter loop are connected to the first or front row and the wires with a longer loop are connected to the second or back row. In other cases, even two or more layers of leads at different elevations are used in a three-dimensional array for wire interconnections in order to spread out the pitch.

For ICs that have centerline bonding pads such as those ICs that are made for dynamic random access memory (DRAM), the leadframe inner leads originate from two opposite sides and end in opposing rows that are in parallel alignment to the IC centerline bonding pads. As the rows of individual leads fan in, their widths shrink gradually in size to meet the narrower pitch of the IC pads. This kind of leadframe layout allows for low cost manufacturing by mechanical stamping from thin copper or alloy foils. Chemical etching may also be used to form the desired patterns.

As the IC sizes shrink and the IC I/O layout becomes more complicated, not all I/O pads will be located in the center or at the perimeter. There are flip chip bumped ICs that have I/O pad layouts in the format of an area array. There are also wafer level packages (WLP) that use a fan out layer to redistribute the I/O pads of the IC from the perimeter or centerline to an area array format. If the area array has a large pitch or a low number of I/Os, it is possible to shape the leadframe metal leads and form a corresponding area array pattern, for example, a 3×3 for a 9-I/O package or a 4×4 for a 16 I/O package. However, for many modern IC memory and ASIC applications, the I/O number is more than 50 and the IC body is reduced to a size of about 10×10 mm or smaller. For such conditions, it is very difficult and time consuming to achieve mass production of a stamped leadframe or even an etched leadframe with fine pitch (less than 200 um) and higher I/O (greater than 50) in an array-area format.

Therefore, it would be desirable to be able to make a leadframe type package by forming the individual inner leads in an area array format with very fine pitch and very small size to accommodate commercially available IC packages that are characterized by very small size and fine pitch in the area array, such as chip scale packages (CSP) and fine pitch ball grid array (FBGA) packages. It is also desirable to be able to use the leadframe package in known standard formats, such as TSOP, QFP or QFN, for accepting other CSP or WLP packages for vertical stacking of one package format on top of another to increase the electronic assembly density and performance without affecting the existing board level footprint or increasing the board area. Likewise, it would be desirable to be able to connect the flip chip IC directly to the individual inner leads while avoiding the space consuming wire bonds and the inherent disadvantages associated therewith, as in the case where a flip chip IC is used for stacking.

SUMMARY OF THE INVENTION

In general terms, disclosed herein is a method for making a leadframe package stand having an external format that is identical to those of commercially available (e.g., QFP, TSOP, QFN and MLF) semiconductor packages in which a flip chip integrated circuit (IC) or an area array (e.g., CSP or WLP) package is assembled to the stand by a solder interconnect. The leadframe package stand functions as an adapter to allow an area array package to be interconnected to printed wiring boards (PWBs) designed for leadframe type packages having perimeter bonding leads. Furthermore, the stand/adapter can also be used to vertically stack the top area array package over a second package directly beneath it, hence achieving vertical stacking over the footprint used for a single package on the PWB.

Inside the leadframe adapter, electrically conductive leadframe traces are arranged in an area array grid pattern on the leadframe skeleton to interface their inner leads to an IC or a WLP package. The outer leads of the leadframe stand are interconnected to the bonding pads on a PWB or any other suitable substrate. Conductive traces extend from the outer leads located at the periphery of the leadframe mold body at which to be connected to the PWB or substrate to inner leads at which to be connected to the IC bonding pads. In accordance with a first preferred embodiment, the tips of the inner leads terminate in two groups at opposite sides of the leadframe skeleton to conform to the typical ball-out patterns of DRAM FBGA packages. Each group of inner lead tips is arranged in an area array pattern including a plurality of parallel-aligned rows and columns, instead of a single row as has been customary for stamped leadframes. Bonding pads having a suitably wide (e.g., circular) configuration are connected to respective inner lead tips of each group to facilitate the IC or paaackage being connected directly to the leadframe traces without the use of intermediate bonding wires as has also been customary in many leadframe packages.

In accordance with another preferred embodiment, the inner leads of the electrically conductive traces on the leadframe skeleton are initially linked together prior to molding by means of a set of sacrificial tie-bars. The tie-bars prevent the individual leads from floating or being displaced relative to one another during the mold process so as to avoid undesirable shifts and possible short circuits between adjacent leads. In an alternate embodiment, the tie-bars may be replaced by thin adhesive tape which links the inner leads so as to prevent a displacement thereof during molding.

During the plastic transfer molding process, a cavity is formed in the mold body by preventing the mold resin from flowing into an area lying above the inner leads and the tie-bars or adhesive tape interconnected therebetween. The cavity is sized to accept a bare chip IC or a wafer level package therewithin. The mold material of the mold body surrounds the inner leads, although the top surfaces of the leads are exposed and lie flush with the bottom of the cavity. Following molding, the sacrificial tie-bars exposed in the cavity are detached from the conductive traces by way of patterned etching or laser ablation. An IC or a wafer level package can then be assembled directly to the exposed inner leads of the conductive traces at the (e.g., circular) bonding pads connected to the inner lead tips. Flip chip bumps and solder balls may, for example, be used to assemble the IC and the package to the leadframe. The IC can then be covered over by an underfill or also an encapsulating material. The resulting leadframe package is now ready for connection to a PWB substrate, motherboard, memory card, cell phone/PDA board or for use in a vertical package over package stacking arrangement.

DESCRIPTION OF THE PREFERRED EMBODIMENT

Figure 1:
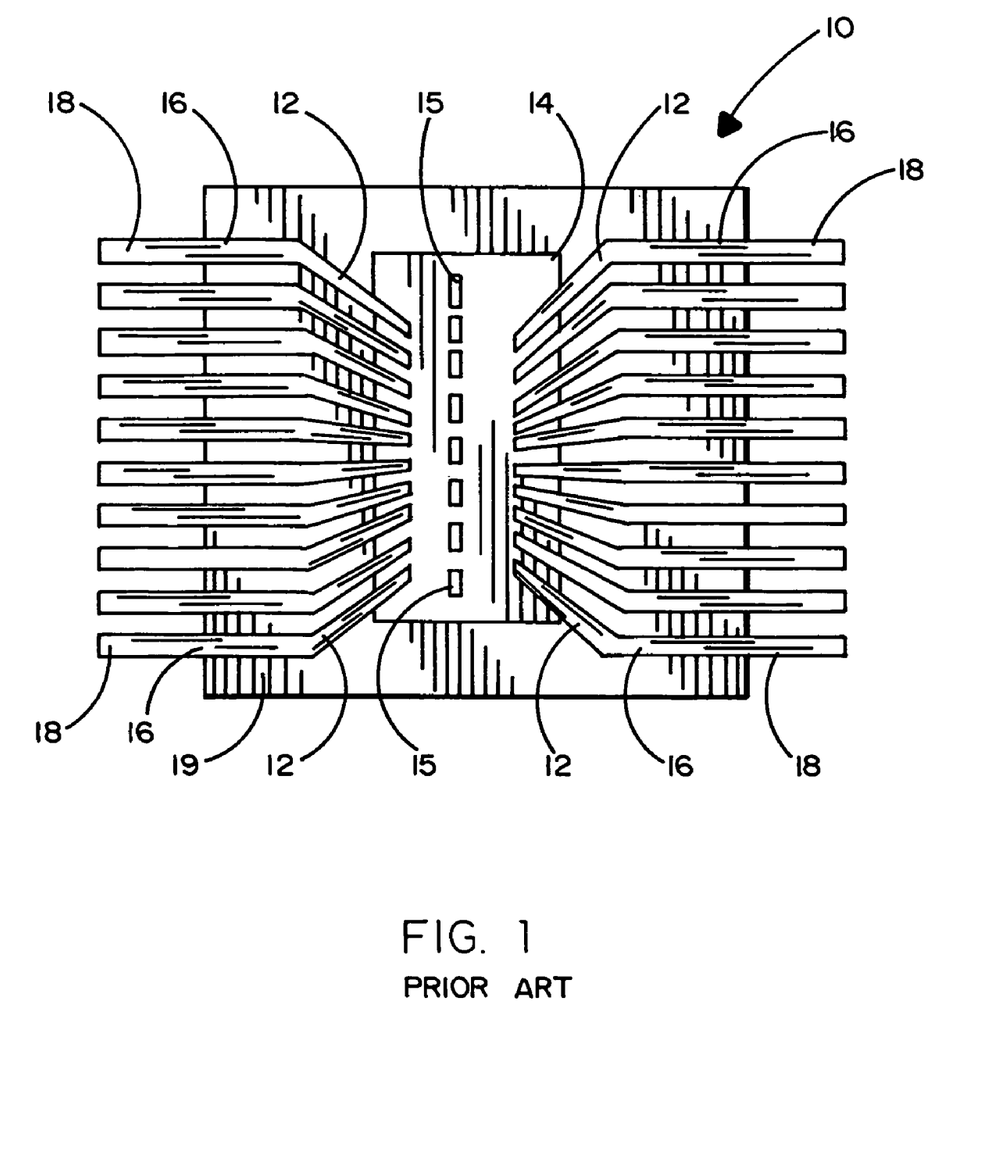
FIG. 1 shows a conventional lead-on-chip (LOC) stamped leadframe with a standard TSOP type 2 fan out.

FIG. 1 of the drawings is illustrative of a conventional lead-on-chip (LOC) leadframe 10 wherein metallic inner leads 12 are aligned with one another so as to terminate along a single row on each side of an IC 14 that is mounted on the underside of leadframe 10. A row of bonding pads 15 extends longitudinally along IC 14 so that wire bonds can be connected between the inner leads 12 and the bonding pads 15. The inner leads 12 extend outwardly by way of conductive traces 16 that terminate at outer leads 18 along two sides of the mold body 19. The outer leads 18 are exposed outside the mold body 19 in order to be bent downwardly in a gull-wing or similar fashion to form external terminations.

In the LOC leadframe configuration of FIG. 1, the inner leads 12 line up parallel to each other with minimum bending or change in direction. This parallel, side-by-side alignment facilitates the manufacture of the inner leads 12 from a foil by means of stamping or chemical etching. A minimum gap must be maintained between the inner leads 12 in order to avoid electrical shorts. The tips of inner leads 12 may be coated with thin layers of surface metals to facilitate wire bonding to gold or aluminum wires (not shown) that interconnect to the IC 14 at bonding pads 15.

Figure 2:
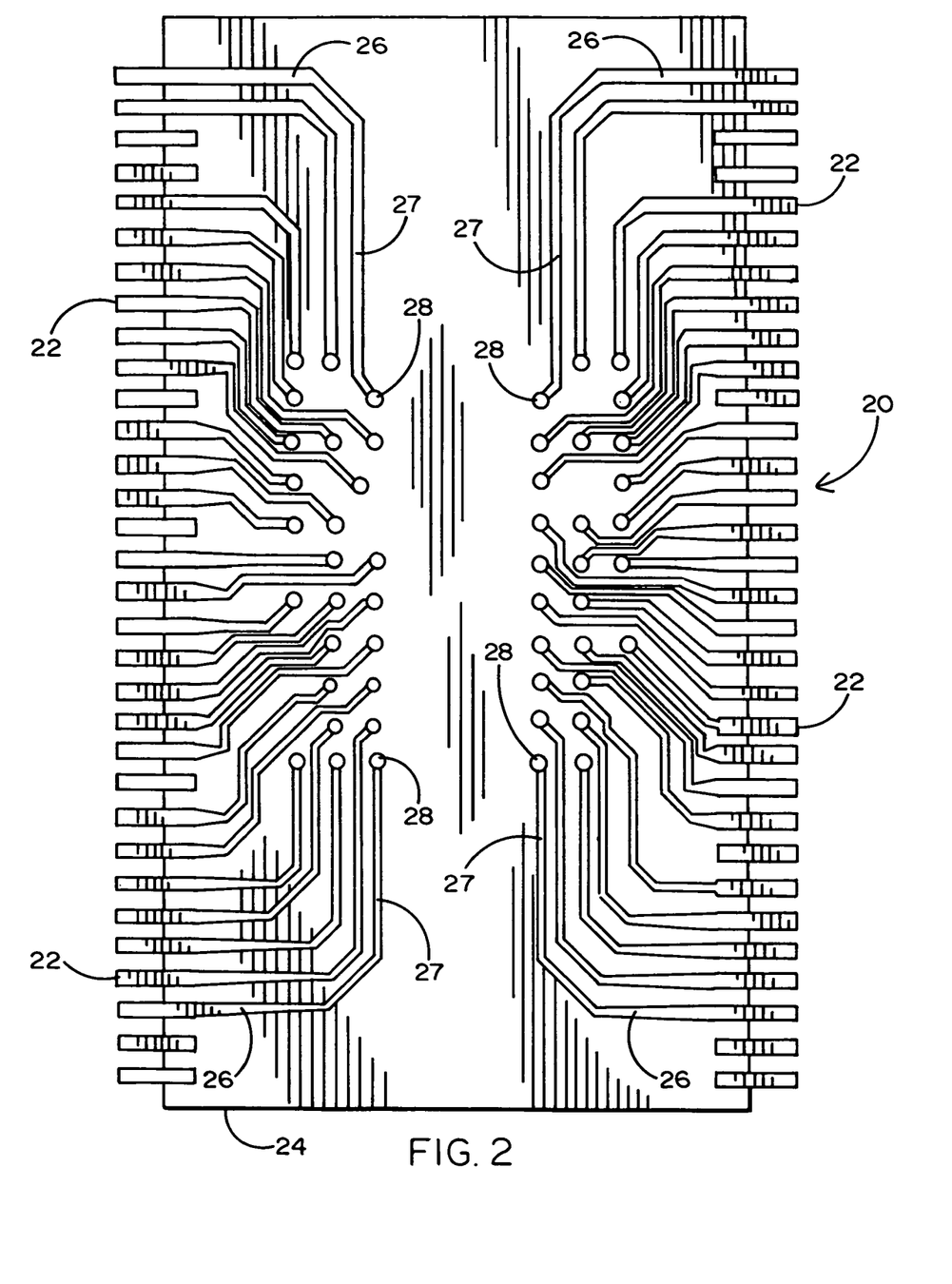
FIG. 2 shows the top of a leadframe having an area array circuit pattern that is formed in accordance with a preferred embodiment of this invention.

In accordance with a preferred embodiment and in order to avoid the wire bonds that are common to leadframes like that shown in FIG. 1, an improved leadframe 20 is shown in FIG. 2 of the drawings having a circuit pattern wherein the outer leads 22 thereof extend outside the mold body 24. The mold body 24 is typically an electronic chemical molding compound (EMC) that is formed by a transfer mold disposed over the base leadframe skeleton. The outer leads 22 are characterized by a standard spacing and width common to conventional leadframe packages, such as a TSOP type 2 format. Electrically conductive fan out traces 26 connect the outer leads 22 to the inner leads 27. The traces 26 on the leadframe 20 of FIG. 2 are bent so that the tips of the inner leads 27 terminate in two groups at opposite sides of the leadframe 20. Each group of inner lead tips is arranged in a plurality of parallel aligned rows and columns of an area array pattern, instead of a single row like that shown for the leadframe 10 of FIG. 1.

Figure 9:
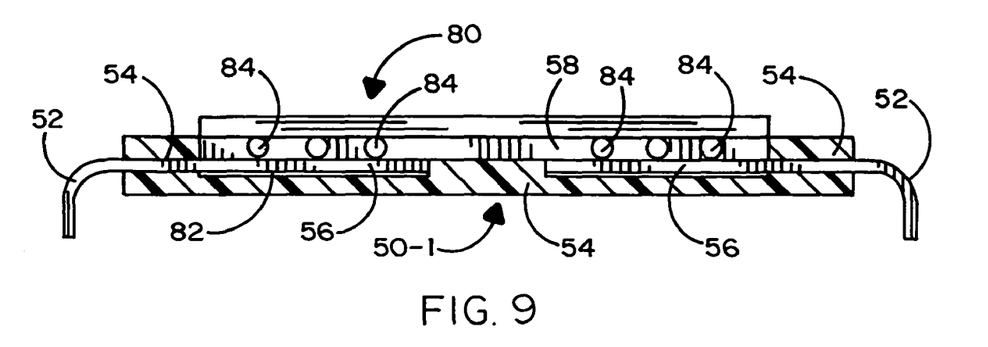

Because the inner leads 27 can now be more widely spaced from one another throughout the area array pattern on both sides of the leadframe 20 of FIG. 2, the tips of the inner leads 27 may now be respectively connected to relatively wide (e.g., circular) pads 28 for bonding directly to flip chip bumps from either an IC (best shown in FIG. 5) or another package having solder ball bumps (best shown in FIG. 9). Accordingly, the inner leads 27 may now be arranged with very fine pitch and small size to be connected to today's very small size (e.g., less than 10 mm) ICs that are characterized by a fine pitch (e.g., less than 100 μm). In this same regard, the fan out traces 26 can be bent and rounted (as opposed to being straight in the manner illustrated in FIG. 1) so as to establish a relatively high density routing pattern between the inner and outer leads 27 and 22.

Figure 3:
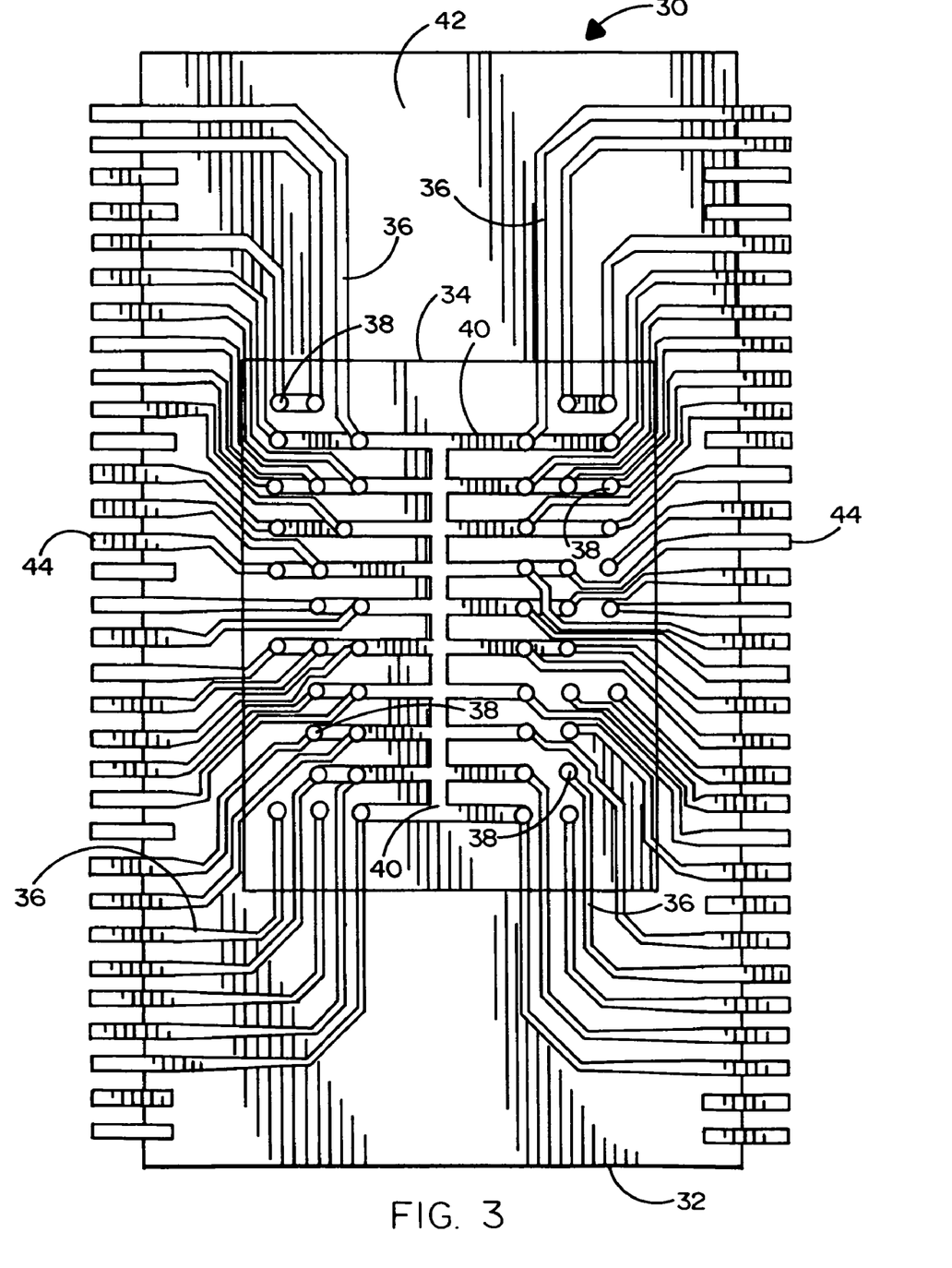
FIG. 3 illustrates the area array circuit pattern shown in FIG. 2 with the inner leads linked together by sacrificial tie-bars located in a cavity that is formed in the mold body.

FIG. 3 of the drawings illustrates an intermediate step used to achieve the desired leadframe circuit pattern shown in FIG. 2. Instead of the circuit pattern on the leadframe 30 of FIG. 3 being completely encapsulated, as is customary in conventional packaging arrangements, a cavity or window 34 is formed in the plastic mold body 32 during the plastic transfer mold process. The cavity 34 may be formed in the mold body 32 during molding by preventing the mold resin from flowing into an area lying above the inner leads 36. By way of particular example, the cavity 34 may be initially covered by a removable film, sheet or insert that is later removed after molding to expose the top surfaces of the inner leads 36 located at the bottom of the cavity 34.

The mold body 32 protects and insulates the individual lead traces once the thermosetting EMC has cured during molding. However, because intricate circuit patterns cannot be easily held in place for molding, there is no certainty that the leads 36 will remain at the same pitch, spacing and location during and after molding. Therefore, to overcome this problem, the lead terminals (in the shape of circular pads 38) for the inner leads 36 are initially linked together during formation of the leadframe circuit pattern by sacrificial tie-bars 40 that are located within the interior of the cavity 34. The tie-bars 40 ensure that the individual leads 36 will not float so that one lead trace does not become undesirably attached to another lead trace. Should the inner leads 36 be permitted to float or move during the mold process because of the force created by the molten resin, the result could be a wide position shift and, consequently, contacts (i.e., shorts) between adjacent leads.

It is preferable that the tie-bars 40 for holding the inner leads 36 in place be manufactured from the same material as that used to make the conductive traces which define the circuit pattern. By way of example, tie-bars 40 may be simply incorporated in the photomask design that is used to lay out the circuit pattern. A chemical etch step can be employed to produce the final circuit pattern including the coextensive tie-bars 40 for linking the inner leads 36 of leadframe 30.

Because a majority of the mold body 32 and the leadframe traces will be encapsulated by a plastic insulating material 42, the inner leads 36 and the contact pads 38 to which the inner leads are connected inside the cavity 34 will not be able to move during molding. The plastic material 42 of mold body 32 should surround the individual inner leads 36 that are located at the interior of cavity 34 so as to fill in the gaps between them, but without completely covering the leads. That is to say, the top surfaces of the leads 36 will remain exposed within cavity 34 and lie flush with the mold material at the bottom of the cavity 34. The outer terminals 44 that are connected to respective inner leads 36 of leadframe 30 are also exposed so that they can be bent and trimmed to form the final external lead terminals that are used in typical TSOP and other types of leadframe packages.

Figure 4:
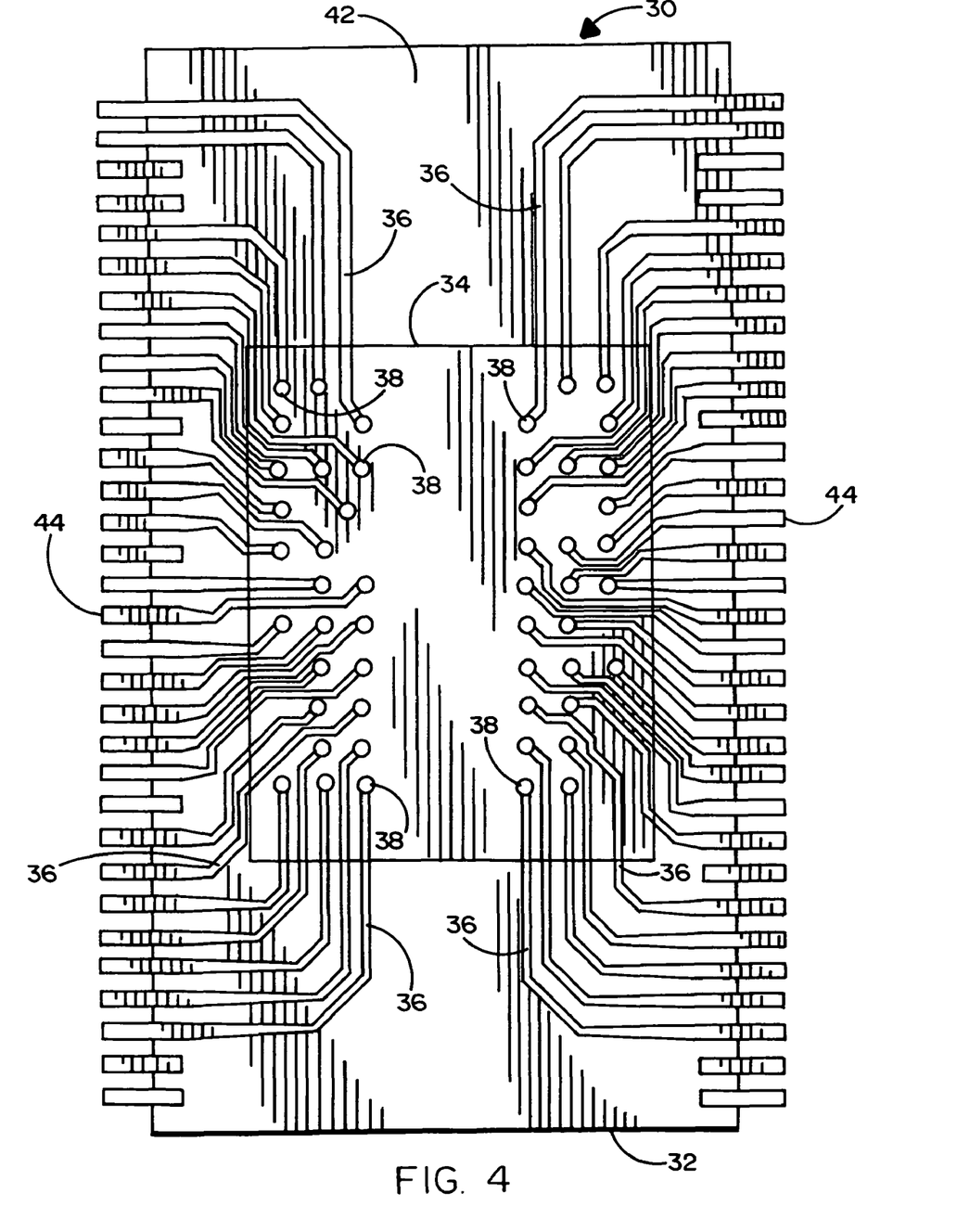
FIG. 4 illustrates the area array circuit pattern of FIG. 3 with the tie-bars removed.

Turning now to FIG. 4 of the drawings, the sacrificial tie-bars 40 shown in FIG. 3 are preferably removed by means of a second etch step. In this case, grooves (not shown) will remain in the mold material 42 at the bottom of the cavity 34 in place of the tie-bars 40 that have been removed therefrom. Alternatively, since the inner leads 36 inside cavity 34 are accessible, the tie-bars 40 can be simply cut off by means of a fine focus laser beam and thereby disconnected from individual inner lead contact pads 38. In this case, short portions of tie-bars (also not shown) will remain embedded in the mold material 42 at the bottom of the cavity 34, but will become non-functional, since they are now separated and isolated from the inner lead contact pads 38. The area array inner lead format is now ready to be assembled directly to a bare chip IC by means of flip chip bumps (of FIG. 5), a wafer level package (of FIG. 9), or any other suitable chip scale package.

Figure 5:
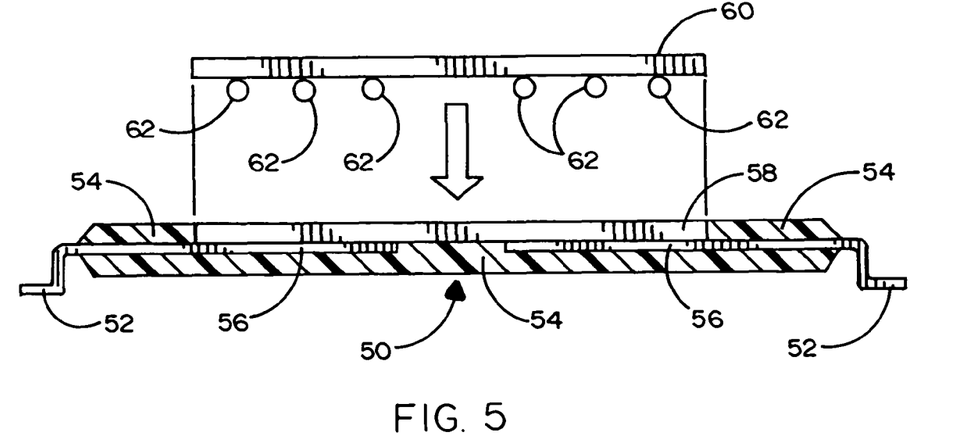
FIG. 5 shows a cross-section of a leadframe package stand according to one preferred embodiment for receipt of a bare chip IC by means of flip chip bumps connected to the exposed inner leads through the cavity in the mold body.

FIG. 5 of the drawings shows a cross-section of a finished leadframe package stand or adapter 50, with the outer leads 52 thereof bent in a gull-wing fashion for assembly to a PWB or other suitable substrate (not shown). Molding 54 covers the lead traces and the area array lead pattern 56 that is located at the bottom of the open cavity 58. A bare chip IC 60 can now be assembled directly to the leadframe package stand 50 inside the cavity 58 by such conventional means as flip chip bumps 62 and flip chip bonding or solder reflow. After assembly, the IC 60 may be underfilled with a liquid underfill material, or the IC 60 may be covered by a liquid encapsulating material for mechanical protection. The assembly may be optionally molded again by filling up the remaining area of cavity 58 once the IC 60 has been assembled therein as previously described. However, it should be appreciated that the ability to assemble the IC 60 directly to the area array lead pattern 56 that is exposed within cavity 58 advantageously avoids the space consumption and increased manufacturing complexity that is associated with intermediate wire bonding techniques that have heretofore been associated with leadframes like that shown in FIG. 1.

The finished leadframe assembly is ready to be surface mounted to a PWB motherboard or substrate. Alternatively, the top IC or IC package and the lower leadframe stand can be assembled in a continuous sequence of steps to a PWB or a substrate, such as a motherboard, a memory card, a cell phone/PDA motherboard, or the like.

Figure 6:
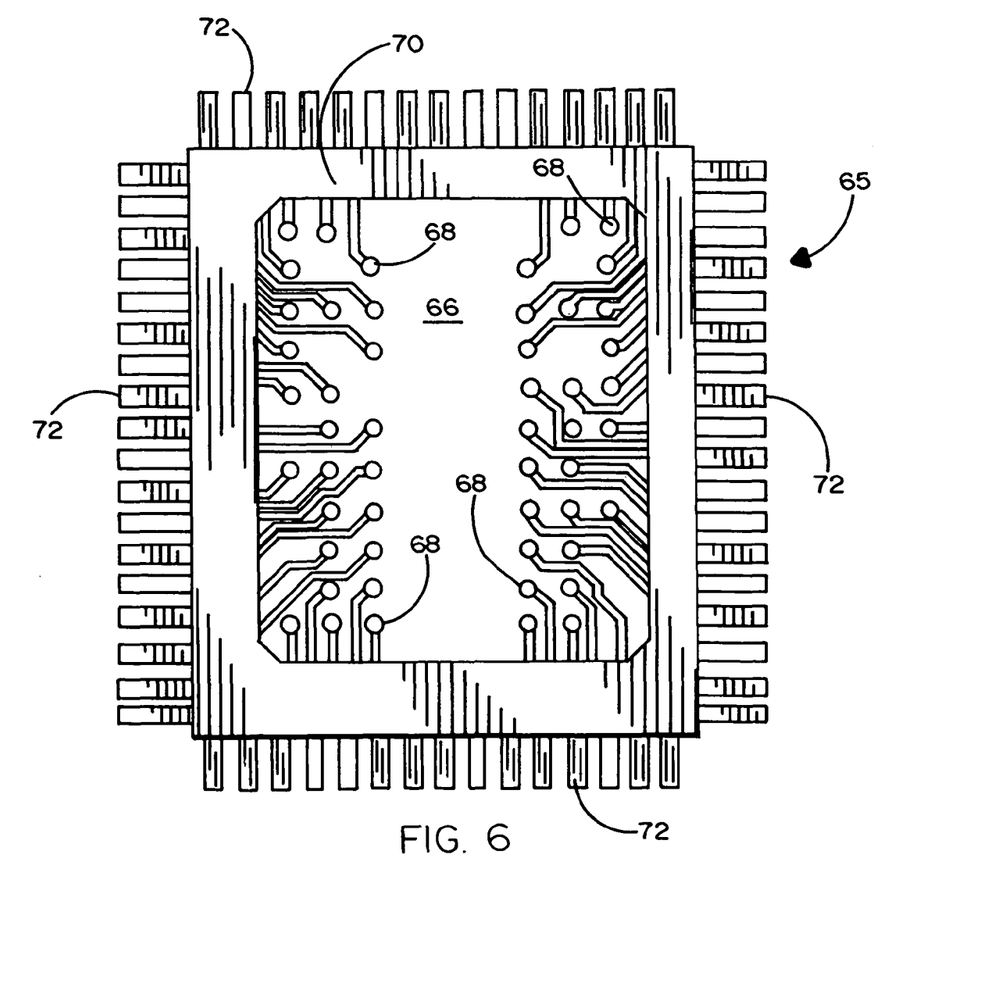
FIG. 6 shows an alternate form factor package with 4-sided perimeter leads and a center cavity.

It should be recognized that the leadframe array area pattern (shown in FIG. 3) can be made to fit the envelope footprint used for various other leadframe package types and sizes, such as QFP, QFN, or microleadframe packages. Referring to FIG. 6 of the drawings, there is shown one example of a cavity leadframe stand 65 with the envelope of a QFP. The inside cavity 66 contains the exposed area array leadframe bonding pads 68. Surrounding the cavity 66 is mold material 70 that covers and fixes the location of individual lead traces. External leads 72 may be exposed along all four of the perimeter edges of the mold body to be trimmed and formed as either gull-wing or J-lead terminals of the type commonly used in leadframe packages.

Figure 7:
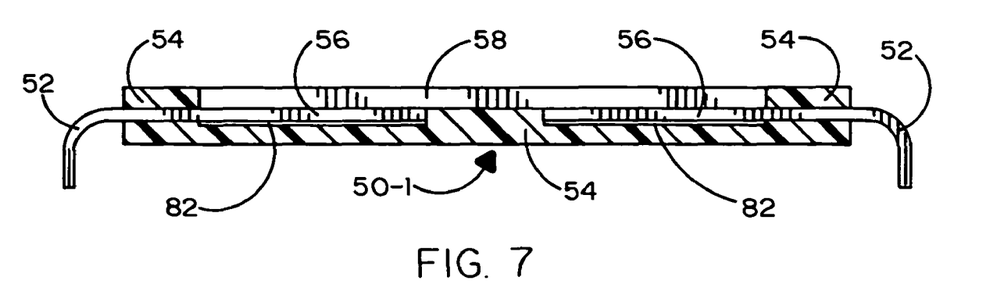
FIGS. 7-9 show a cross-section of a leadframe package stand according to another preferred embodiment for receipt of a wafer level package by means of solder balls connected to the exposed inner leads through the cavity in the mold body.
Figure 8:
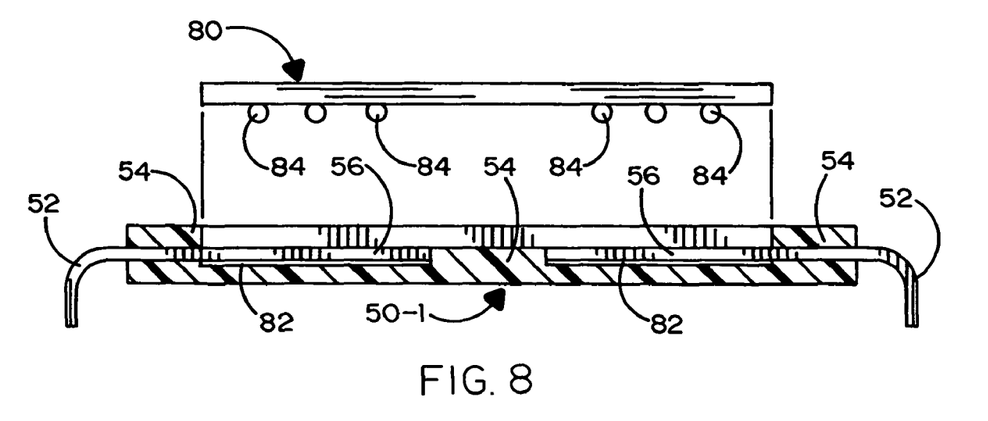

Instead of receiving a bare chip IC 60 as shown in FIG. 5, FIGS. 7-9 of the drawings show a leadframe package stand or adapter 50-1 now being used to receive a wafer level package 80 of the type which carries an integral IC. The package 80 (best shown in FIGS. 8 and 9) may be a well known BGA or CSP package, or the like. The package stand/adapter 50-1 of FIGS. 7-9 is substantially identical to the package stand/adapter 50 of FIG. 5 and, therefore, identical reference numbers have been used to designate identical elements. However, as an important distinction, the stand 50-1 of FIGS. 7-9 includes a thin layer of adhesive (e.g., tape) 82 that is laid between the area array lead pattern 56 that is exposed within the cavity 58 and the molding material 54 along the bottom of the leadframe package stand 50-1 which lies below cavity 58.

In this case, the adhesive layer 82 replaces the sacrificial tie-bars 40 that were described while referring to FIGS. 3 and 4. That is to say, the adhesive layer 82 is used to prevent the area array lead pattern 56 from moving during the molding of lealdframe package stand 50-1 by means of linking the inner leads to one another within the cavity 58 in order to avoid the possibility of inadvertent contact and short circuits therebetween. The adhesive layer 82 is preferably applied after the leadframe is formed (e.g., by means of chemical etching or stamping), but before molding.

Since the adhesive layer 82 is electrically non-conductive, it does not have to be removed from the area array lead pattern 56, but may be left in place below the inner leads as the wafer level package 80 is moved through cavity 58 in the manner shown in FIG. 8. To this end, solder balls 84 are located at the bottom of package 80. The package 80 can be assembled to the leadframe package stand 50-1 by solder interconnections between solder balls 84 and the contact pads (designated 38 in FIG. 4) of the inner leads 56 which are exposed inside cavity 58.

The leadframe fabrication method disclosed herein enables ICs to be assembled to leadframe packages with flip chip bumps (as shown in FIG. 5) or to wafer level packages with area array bumps (as shown in FIGS. 7-9). Such packages will be particularly useful as an interposer during the assembly of vertically stacked packages or a 3-dimensional package-on-package or package-over-package configuration. This 3-dimensional stacking is advantageous for increasing the assembly package density and performance without increasing the assembly footprint or the consumption of board area.

I claim:

1. A method for making a leadframe package stand for a semiconductor integrated circuit (IC) device, said method including the steps of:

forming a leadframe having an area array circuit pattern of electrically conductive traces, said conductive traces fanning from outer leads located at the perimeter of the leadframe to inner leads positioned for connection to the IC device;

forming a mold body for encapsulating said electrically conductive traces on said leadframe;

forming a cavity in said mold body;

arranging the tips of the inner leads of said electrically conductive traces so as to be exposed at the interior of said cavity and lie in a plurality of parallel aligned rows at opposite sides of the IC device; and linking the inner leads of said electrically conductive traces to one another by means of tie-bars for preventing the exposed tips of said inner leads from moving relative to one another.

2. The method for making a leadframe package stand as recited in claim 1, including the additional steps of spacing said plurality of parallel aligned rows of the exposed tips of said inner leads of said electrically conductive traces from one another, and connecting a plurality of relatively wide bonding pads to respective ones of said tips so that the IC device can be connected directly to said bonding pads without the use of intermediate bonding wires.

3. The method for making a leadframe package stand as recited in claim 1, including the additional step of sizing said cavity formed in said mold body for receipt of the IC device so that the IC device can be connected to said exposed tips of the inner leads at the interior of said cavity without the use of intermediate bonding wires.

4. The method for making a leadframe package stand as recited in claim 3, wherein the IC device is a bare chip IC, and including the additional step of connecting the bare chip IC to the exposed tips of the inner leads of said electrically conductive traces at the interior of said cavity by means of electrically conductive flip chip bumps located therebetween.

5. The method for making a leadframe package stand as recited in claim 3, wherein the IC device is a wafer level package, and including the additional step of connecting the wafer level package to the exposed tips of the inner leads of said electrically conductive traces at the interior of said cavity by means of solder balls located therebetween.

6. The method of making a leadframe package stand as recited in claim 3, wherein the IC device is a chip scale package, and including the additional step of connecting the chip scale package to the exposed tips of the inner leads of said electrically conductive traces at the interior of said cavity by means of solder balls located therebetween.

7. The method for making a leadframe package stand as recited in claim 1, including the additional step of forming said cavity in said mold body such that the exposed tips of the inner leads of said electrically conductive traces lie flush with said mold body at the bottom of said cavity.

8. The method for making a leadframe package stand as recited in claim 1, including the additional steps of forming said cavity by molding said mold body from electrically insulating material and preventing said insulating material from flowing into an area lying above the exposed tips of the inner leads of said electrically conductive traces during said molding step.

9. The method for making a leadframe package stand as recited in claim 1, including the additional steps of forming said cavity by molding said mold body from electrically insulating material, filling an area lying above the exposed tips of the inner leads of said electrically conductive traces with a removable covering prior to said molding step, and removing said covering after said molding step to permit access to said exposed inner leads.

10. The method for making a leadframe package stand as recited in claim 1, including the additional step of chemical etching said electrically conductive traces with said tie-bars coextensively connected to said inner leads thereof.

11. The method for making a leadframe package stand as recited in claim 1, including the additional step of detaching said tie-bars following the step of forming said cavity in said mold body so as to separate said tie-bars from the inner leads of said electrically conductive traces.

12. A method for making a leadframe package stand for a semiconductor integrated circuit (IC) device, said method including the steps of:

forming a leadframe having an area array circuit pattern of electrically conductive traces, said traces fanning from outer leads located at the perimeter of said leadframe to inner leads positioned for connection to the IC device;

encapsulating said leadframe with an electrically insulating material;

forming a cavity through said encapsulated leadframe for receipt of the IC device, said cavity lying above the inner leads of said conductive traces, whereby said inner leads are exposed within said cavity, said cavity being formed by molding said mold body from electrically insulating material, filling an area lying above the exposed inner leads of said electrically conductive traces with a removable covering prior to said molding, and removing said removable covering after said molding to permit access to said exposed inner leads; and locating the IC device within said cavity through said leadframe, and connecting the IC device to the exposed inner leads of said electrically conductive traces at the interior of said cavity without intermediate bonding wires.

13. The method for making a leadframe package stand as recited in claim 12, including the additional step of arranging the tips of the inner leads of said electrically conductive traces of said area array circuit pattern in a plurality of parallel aligned rows and columns along opposite sides of the said cavity through the leadframe.

14. The method for making a leadframe package stand as recited in claim 12, wherein the IC device is a bare chip IC, and including the additional step of connecting the bare chip IC to the exposed inner leads of said electrically conductive traces at the interior of said cavity by means of electrically conductive flip chip bumps located therebetween.

15. The method for making a leadframe package stand as recited in claim 12, wherein the IC device is a wafer level package, and including the additional step of connecting the wafer level package to the exposed inner leads of said electrically conductive traces at the interior of said cavity by means of solder balls located therebetween.

16. The method for making a leadframe package as recited in claim 12, including the additional step of preventing the inner leads of said electrically conductive traces to be exposed within said cavity of said encapsulated leadframe from moving relative to one another prior to the step of encapsulating said leadframe with an electrically insulating material.

17. A method for making a leadframe package stand for a semiconductor integrated circuit (IC) device, said method including the steps of:

forming a leadframe having an area array circuit pattern of electrically conductive traces, said conductive traces fanning from outer leads located at the perimeter of the leadframe to inner leads positioned for connection to the IC device;

encapsulating the electrically conductive traces of said area array circuit pattern within a mold body;

forming a cavity inside said mold body such that at least some of the tips of the inner leads of said conductive traces of said area array circuit pattern are exposed within said cavity and arranged so as to lie in a plurality of spaced, parallel aligned rows and columns at opposite sides of the IC device;

forming said cavity in said mold body by molding said mold body from electrically insulating material, filling an area lying above the at least some exposed tips of the inner leads of said electrically conductive traces with a removable covering prior to said molding step, and removing said removable covering after said molding step to permit access to the exposed tips;

connecting a bonding pad to each of said at least some tips of said inner leads; and moving an IC device through the cavity of said mold body and connecting the IC device directly to the bonding pad connected to each of said at least some tips of said inner leads exposed within said cavity without the use of intermediate bonding wires.

18. The method for making a leadframe package stand as recited in claim 17, including the additional step of connecting the IC device to the bonding pads connected to said plurality of spaced, parallel aligned rows and columns of the at least some tips of the inner leads of said traces exposed within said cavity by means of locating an electrically conductive flip chip bump between the IC device and each bonding pad of each of the at least some tips.

19. The method for making a leadframe package stand as recited in claim 17, including the additional step of connecting the IC device to the bonding pads connected to said plurality of spaced, parallel aligned rows and columns of the at least some tips of the inner leads of said traces exposed within said cavity by means of locating a solder ball between the IC device and each bonding pad of each of the at least some tips.

20. The method for making a leadframe package stand as recited in claim 17, including the additional step of preventing said plurality of spaced, parallel aligned rows and columns of the at least some tips of the inner leads of said traces exposed within said cavity from moving relative to one another.

* * * * *